(12) United States Patent  (10) Patent No.: US 8,765,331 B2
Gallagher et al.  (45) Date of Patent: Jul. 1, 2014

(54) REDUCING EDGE DIE REFLECTIVITY IN EXTREME ULTRAVIOLET LITHOGRAPHY

(75) Inventors: Emily E. Gallagher, Burlington, VT (US); Gregory R. McIntyre, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/587,970

(22) Filed: Aug. 17, 2012

(65) Prior Publication Data

US 2014/0051015 A1 Feb. 20, 2014

(51) Int. Cl.
G03F 1/38 (2012.01)
G03F 1/24 (2012.01)
H01L 21/027 (2006.01)

(52) U.S. Cl.
USPC .............................................. 430/5

(58) Field of Classification Search
CPC .......... G03F 1/22; G03F 24/38; H01L 21/027
USPC ......................................... 430/5, 30; 378/35
See application file for complete search history.

(56) References Cited

U.S. PATENT DOCUMENTS

| | | | |
|---|---|---|---|
| 5,446,521 A | 8/1995 | Hainsey et al. | |
| 5,716,738 A | 2/1998 | Garza | |
| 5,786,114 A | 7/1998 | Hashimoto | |
| 5,817,439 A | 10/1998 | Tzu et al. | |
| 6,001,512 A | 12/1999 | Tzu et al. | |
| 6,558,856 B2 | 5/2003 | Pierrat | |
| 6,777,137 B2 | 8/2004 | Fisch et al. | |
| 6,803,158 B1 | 10/2004 | Gordon et al. | |
| 6,825,988 B2 | 11/2004 | Bristol | |
| 6,854,106 B2 | 2/2005 | Baggenstoss et al. | |
| 7,049,035 B2 | 5/2006 | Kindt et al. | |
| 7,160,651 B2 * | 1/2007 | Pinkerton et al. | 430/5 |
| 7,282,307 B2 | 10/2007 | Hector et al. | |
| 7,736,820 B2 | 6/2010 | Van Herpen et al. | |
| 8,105,735 B2 | 1/2012 | Kinoshita | |
| 2010/0284064 A1 | 11/2010 | Kruizinga et al. | |
| 2011/0104595 A1 | 5/2011 | Hayashi et al. | |
| 2011/0165504 A1 | 7/2011 | Ikuta | |
| 2012/0135339 A1 * | 5/2012 | Kim et al. | 430/5 |

FOREIGN PATENT DOCUMENTS

JP 2006179553 7/2006
JP 2010062244 3/2010

OTHER PUBLICATIONS

Davydova, N. et al., "Imaging performance improvements by EUV mask stack optimization", BACUS News, vol. 27, Issue 8, Aug. 2011, pp. 1-13.
Farhad, S. et al., "Multilayer Phase-Only Diffraction Gratings: Fabrication and Application to EUV Optics", http://escholarship.org/uc/item/3bx376h7, Lawrence Berkeley National Laboratory, May 1, 2007, 18 pages.

(Continued)

Primary Examiner — Stephen Rosasco
(74) Attorney, Agent, or Firm — Richard Kotulak; Roberts Mlotkowski Safran & Cole, P.C.

(57) ABSTRACT

Extreme ultraviolet lithography (EUVL) masks and methods of manufacturing are provided. A method includes forming a sub-resolution phase shift grating in a multilayer reflective film beneath a border region of an absorber layer of an extreme ultraviolet lithography (EUVL) mask. The sub-resolution phase shift grating reduces a reflectivity of the border region of the mask.

24 Claims, 8 Drawing Sheets

(56) References Cited

OTHER PUBLICATIONS

Paivanranta, B. et al., "Sub-10 nm patterning using EUV interference lithography", IOP Publishing, Nanotechnology 22, Aug. 19, 2011, pp. 1-7.

Kamo, T. et al., "Light-shield border impact on the printability of extreme-ultraviolet mask", Journal of Micro/ Nanolithography, MEMS and MOEMS, Apr. 13, 2011, 9 pages.

* cited by examiner

| | 0 | 10 | 20 | 30 | 40 | 50 | 60 | 70 |
|---|---|---|---|---|---|---|---|---|
| Mask with ML grating | 77.9% | 38.9% | 24.4% | 14.7% | 6.4% | 5.8% | 2.2% | 1.5% |
| Mask without grating | 29.2% | 17.0% | 8.1% | 6.9% | 2.5% | 2.1% | 1.4% | 0.3% |
| Percent Reduction | 62.5% | 56.3% | 67.0% | 53.5% | 61.0% | 63.4% | 39.5% | 78.0% |

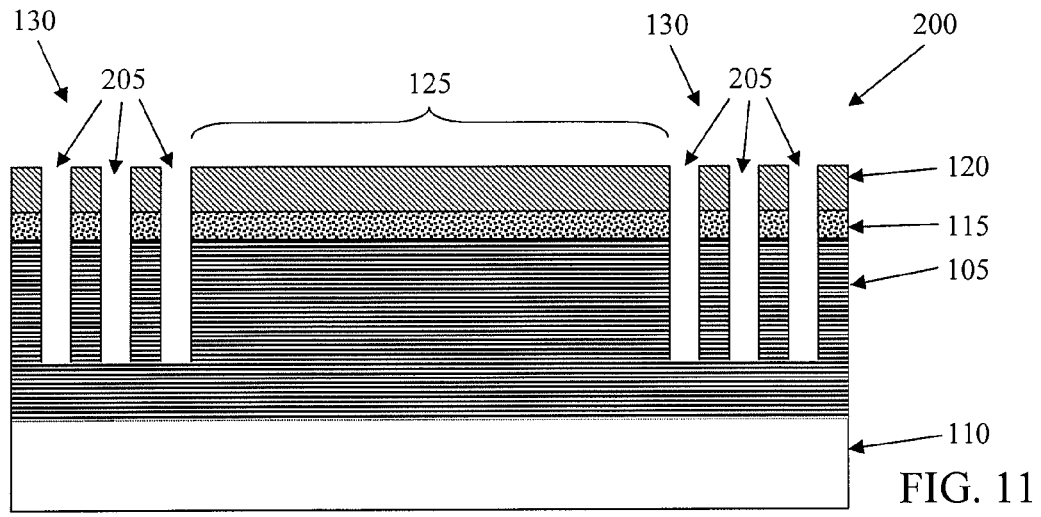
FIG. 11
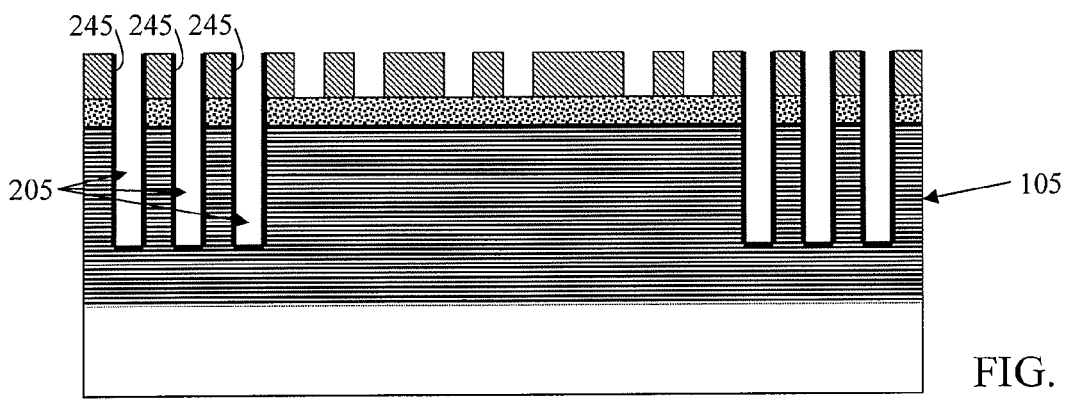
FIG. 12
| 255 → | | Thickness of Absorber Layer (nm) | | | | | | | |
|---|---|---|---|---|---|---|---|---|---|
| | | 0 | 10 | 20 | 30 | 40 | 50 | 60 | 70 |
| Etch Depth (nm) | 0 | 0.0% | -28.1% | -57.8% | -71.8% | -220.2% | -161.6% | -415.8% | -509.9% |
| | 20 | 9.8% | -14.8% | -38.4% | -36.6% | -152.6% | -86.0% | -301.4% | -346.6% |
| | 40 | 17.5% | 7.2% | -9.4% | 2.6% | -77.3% | -24.9% | -195.2% | -175.2% |
| | 60 | 32.2% | 30.8% | 24.8% | 39.6% | -18.3% | 26.3% | -97.3% | -53.2% |
| | 80 | 49.3% | 53.1% | 51.8% | 67.8% | 32.5% | 64.5% | 3.6% | 30.2% |
| | 100 | 65.4% | 71.6% | 74.3% | 85.5% | 70.1% | 85.9% | 44.8% | 78.0% |
| | 120 | 79.4% | 87.7% | 90.8% | 96.4% | 92.7% | 94.8% | 81.7% | 71.3% |
FIG. 13

355

| | Thickness of Absorber Layer (nm) | | | | | | | |
|---|---|---|---|---|---|---|---|---|
| | | 0 | 10 | 20 | 30 | 40 | 50 | 60 | 70 |
| Etch Depth (nm) | 0 | 0.0% | 0.0% | 0.0% | 0.0% | 0.0% | 0.0% | 0.0% | 0.0% |
| | 20 | 9.8% | 9.5% | 6.2% | 10.4% | 6.8% | 4.2% | 15.0% | -6.3% |
| | 40 | 17.5% | 20.4% | 12.9% | 22.4% | 17.4% | 14.1% | 31.7% | -2.2% |
| | 60 | 32.2% | 34.5% | 26.7% | 37.4% | 30.7% | 26.6% | 48.8% | 3.9% |
| | 80 | 49.3% | 53.4% | 44.6% | 55.6% | 48.3% | 43.9% | 67.4% | 21.2% |
| | 100 | 65.4% | 69.4% | 60.1% | 70.7% | 64.0% | 59.4% | 81.6% | 38.5% |
| | 120 | 79.4% | 83.1% | 75.4% | 84.0% | 79.4% | 74.6% | 92.4% | 56.0% |

REDUCING EDGE DIE REFLECTIVITY IN EXTREME ULTRAVIOLET LITHOGRAPHY

FIELD OF THE INVENTION

The invention relates to semiconductor structures and methods of manufacture and, more particularly, to a mask used in extreme ultraviolet lithography and method of manufacturing.

BACKGROUND

Lithography is a technique for applying patterns to the surface of a workpiece, such as a circuit pattern to a semiconductor chip or wafer. Traditional optical photolithography involves applying electromagnetic radiation to a mask having openings formed therein (i.e., a transmission mask) such that the light or radiation that passes through the openings is applied to a region on the surface of the workpiece that is coated with a radiation-sensitive substance (e.g., a photoresist). Such traditional optical photolithography is reaching its resolution limit, however, due to the wavelength of electromagnetic radiation usable with transmissive masks.

An emerging candidate for finer resolution lithography uses Extreme Ultraviolet (EUV) light to image patterns on an area of a wafer. EUV light has a wavelength in a range of about 10 nm to 20 nm, in particular about 13.4 nm to 13.5 nm. EUV lithography (EUVL) employs reflective masks rather than transmissive masks since the EUV light at such a small wavelength is prone to be absorbed by materials used in a transmissive mask.

EUVL masks include a reflective film (e.g., a Bragg reflector) arranged on an ultra low expansion (ULE) substrate and a pattern of absorber material on the reflective film. The exposure light is incident on the mask at a shallow angle, e.g., about 5 or 6 degrees, relative to the perpendicular direction to the mask. Some of the incident light is reflected by the reflective film and some of the incident light is absorbed by the absorber material, thus producing a predefined pattern of light that is ultimately applied onto an area of a wafer, e.g., to expose a pattern in a photoresist on the wafer.

The pattern of absorber material and exposed portions of the reflective film are contained in an active area (also referred to as a primary pattern, pattern region, image field, etc.) of the EUVL mask. The EUVL mask also includes a border region (also referred to as a black border area) composed of an about 2-3 mm wide strip of absorber material that surrounds the active area. The same EUVL mask may be used many times in succession to provide the same predefined pattern of light on different areas (e.g., different dies) of a single wafer, and the border region is used to isolate the individual patterns as they are exposed on the wafer surface.

In order to provide desired pattern dimensional accuracy, the thickness of the layer of absorber material used in EUVL masks is typically constrained to be less than that which provides complete absorption of the incident EUV light. Thus, some of the incident EUV light is reflected even in areas of the mask covered by the absorber material. For example, the reflectivity of EUVL mask absorber material can range from about 1-3%.

This non-negligible absorber reflectivity in EUVL masks creates the potential for unwanted reflections from one exposure into the periphery of a neighboring exposure die. This is referred to as black border reflectivity and is a function of both absorber material reflectivity and placement of the reticle masking (REMA) blades that are used within the scanner to confine light to the active area. The reflective nature of an EUVL system requires the REMA blades be placed in front of the mask. To accommodate both a potential variation in the REMA blade placement and the fact that the REMA blade cannot be located in the mask image plane, a standoff distance between the REMA blade to the edge of the active area is provided. Thus, some incident EUV light impinges on the absorber material at the border region that surrounds the active area. This results in what is referred to as the black border reflection, where light reflected from this border region contributes unwanted intensity to a neighboring exposure die. Furthermore, because the REMA blade is not in the mask focal plane, a half-shadow, or penumbra, spatial signature to the black border reflection is observed.

Accordingly, there exists a need in the art to overcome the deficiencies and limitations described hereinabove.

SUMMARY

In a first aspect of the invention, there is a method of manufacturing a mask. The method includes forming a sub-resolution phase shift grating in a multilayer reflective film beneath a border region of an absorber layer of an extreme ultraviolet lithography (EUVL) mask. The sub-resolution phase shift grating reduces a reflectivity of the border region of the mask.

In another aspect of the invention, there is a method of manufacturing a mask including forming plural protrusions on an upper surface of a substrate. The method also includes forming a multilayer reflective film on the plural protrusions and the upper surface of the substrate. The method additionally includes forming a buffer layer on the multilayer reflective film. The method further includes forming an absorber layer on the buffer layer. Moreover, the method includes patterning an active area of the absorber layer with a pattern for applying to an area of a wafer. The plural protrusions are formed in an area corresponding to a border region outside that surrounds the active area.

In yet another aspect of the invention, an extreme ultraviolet lithography (EUVL) mask includes: a substrate; a multilayer reflective film on the substrate; a buffer layer on the multilayer reflective film; and an absorber layer on the buffer layer and comprising an active area and a border region. The multilayer reflective film comprises a sub-resolution phase shift grating in areas underneath the border region. The sub-resolution phase shift grating reduces the reflectivity of the border region of the mask.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 6-12 show processing steps and structures in accordance with aspects of the invention;

FIG. 13 shows the percent reduction in black border reflectivity for various etch depths and absorber thickness values, demonstrating how an EUVL mask of FIG. 11 reduces reflection at the border region;

DETAILED DESCRIPTION

The invention relates to semiconductor structures and methods of manufacture and, more particularly, to a mask used in extreme ultraviolet lithography and method of manufacturing. According to aspects of the invention, the reflective film at the border region of an EUVL is formed with a phase shift structure that creates destructive interference which reduces the reflectivity of the EUVL mask in the border region. In embodiments, the multilayer reflective film of the EUVL mask is formed with a sub-resolution phase shift grating that scatters light out of the lens, thus reducing the effective reflectivity of the absorber material at the border region. The grating may be provided by periodic roughness at the surface of the EUVL mask substrate that is propagated upward through the multilayer reflective film, or by trenches etched at the top portion of the multilayer reflective film. In either case, the grating is structured and arranged to constitute an approximate 180° phase shift grating that suppresses or cancels the 0th order diffraction at the border region of the EUVL mask. In this way, a significant decrease in the black border reflection of the incident EUV light at the border region of the EUVL mask is provided.

Figure 1:
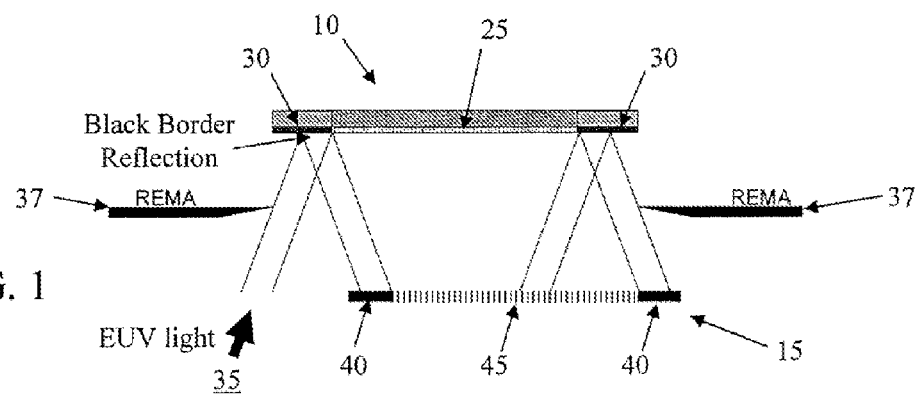
FIG. 1 shows a diagram of an EUVL system.

FIG. 1 shows a simplified diagram of an EUVL system comprising an EUVL mask 10 and a wafer 15 upon which a predefined pattern of light is projected, e.g., to expose a pattern of photoresist on the wafer 15. The mask 10 includes a conventional EUVL mask having a multilayer reflective film arranged on a substrate, a pattern of absorber material in an active area 25, and a continuous strip of absorber material at a border region 30 surrounding the active area 25. EUV light from a light source 35 is reflected by the mask 10 onto the wafer 15. Reticle masking (REMA) blades 37 are located in front of the mask 10, e.g., on a same side of the mask 10 as the wafer 15. Although not shown, it is understood that the EUVL system may contain a plurality of mirrors that serve as reduction optics between the mask 10 and the wafer 15 that reduce the projection area of the pattern of EUV light reflected by the mask 10 (typically by a ratio of 4:1) and direct the reflected pattern of EUV light onto the wafer 15.

As depicted in FIG. 1, some of the EUV light that is incident on the mask 10 is reflected at the border region 30. This border reflection can cause light to be applied to the wafer 15 at areas 40 outside of the target active area 45. For a mask 10 having an absorber material with a reflectivity of about 1-3%, this border reflection can lead to a CD (critical dimension) error of about 2-8 nm due to reflected light from a neighboring die (e.g., an adjacent target active area 45). This causes undesirable CD variation near the edges of the product die, as depicted by the data plotted in FIG. 2.

Figure 2:
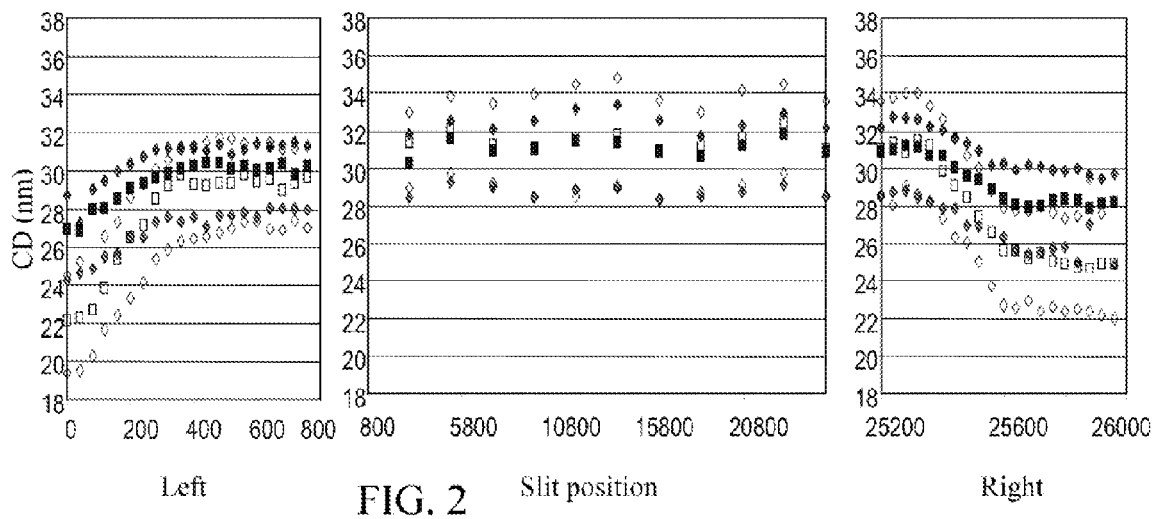
FIG. 2 shows data demonstrating CD (critical dimension) variation due to black border reflection.

In particular, FIG. 2 shows three graphs corresponding to a single die in which CD is represented by the vertical axis and slit position is represented by the horizontal axis. It is evident from FIG. 2 that CD variation can be substantial at the leftmost and right-most slit positions, this CD variation being due to the border reflection from border region 30 of the mask 10.

Figure 3:
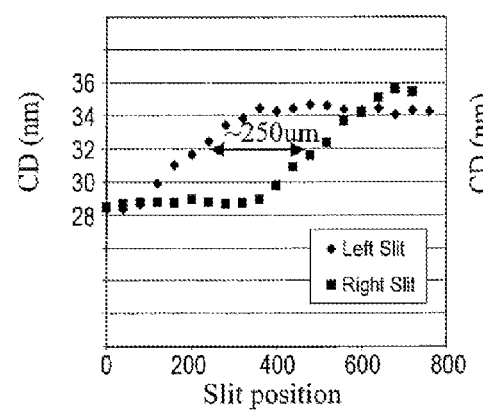
FIG. 3 shows data demonstrating a penumbra effect in the system of in FIG. 1 and a dependence of the spatial signature and penumbra location on placement of the REMA blades, shown in this example to differ between the left and right sides of the imaging slit.

FIG. 3 demonstrates the penumbra effect of the REMA blades 37 in the system depicted in FIG. 1. In particular, FIG. 3 shows a graph of CD versus slit position for left and right slit positions. Because the REMA blades 37 are not in the mask focal plane, a half-shadow, or penumbra, spatial signature to the black border reflection is generated. The data in FIG. 3 demonstrates that the location of the penumbra from the REMA blades 37 is not uniform from left to right slit positions.

Figure 4:
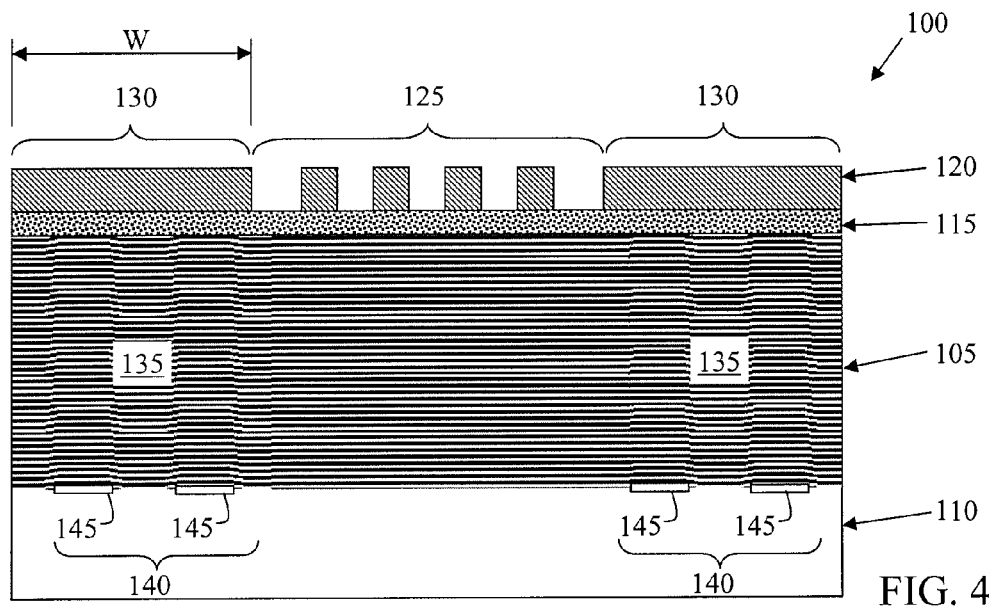
FIG. 4 shows an EUVL mask in accordance with aspects of the invention.

FIG. 4 shows an EUVL mask 100 in accordance with aspects of the invention. In embodiments, the mask 100 includes a multilayer reflective film 105 (referred to herein as ML 105) arranged on a substrate 110. The substrate 110 may be composed of, for example, ultra-low expansion titanium silicate glass, although any suitable material may be used within the scope of the invention. The ML 105 includes multiple layers of materials with alternating index of refraction for providing a resonant reflectivity when the period of the layers is approximately one half the wavelength of the radiation used in the imaging system. In an exemplary implementation, the ML 105 comprises alternating layers of molybdenum (Mo) and silicon (Si), which are alternately layered at thicknesses of about 2 to 5 nm, although other materials and thicknesses may be used within the scope of the invention. The ML 105 may comprise any suitable number of layers of Si and Mo, such as, for example, about 30 to 80 paired layers of Mo/Si.

Formed on the top layer of the ML 105 is a buffer layer 115 composed of ruthenium (Ru), although other materials such as tantalum nitride (TaN), silicon dioxide ($SiO_2$), carbon (C), and mixtures of these materials may be used. As shown in FIG. 4, an absorber layer 120 is arranged on the buffer layer 115, where the material used for the absorber layer 120 is absorptive of radiation at the wavelength used in the imaging system and can be selectively etched. The absorber layer 120 may be composed of any suitable material or composition, such as, for example, nickel (Ni), a cobalt nickel alloy (CoNi), tantalum (Ta), tantalum nitride (TaN), and tantalum boron nitride (TaBN).

Still referring to FIG. 4, the mask 100 comprises an active area 125 surrounded by a border region 130. The active area 125 is an area of the mask 100 in which the absorber layer 120 may be patterned using conventional semiconductor processing techniques, e.g., masking and selectively etching the material of the absorber layer 120. As is understood by those of ordinary skill in the art, the pattern created in the absorber layer 120 at the active area 125 defines the pattern of light that is provided to a die location on a wafer in the EUVL system. As such, any desired pattern may be provided in the active area 125. The border region 130 comprises a relatively wide strip of absorber layer 120 that surrounds the active area 125. In embodiments, the border region 130 has a width "W" of about 2-3 mm, although any suitable width may be used within the scope of the invention.

As further depicted in FIG. 4, and according to aspects of the invention, the portions of the ML 105 that are under the absorber layer 120 in the border region 130 are formed with a sub-resolution phase shift grating 135. In embodiments, the grating 135 is provided by forming a periodic roughness 140 on the surface of the substrate 110 in the area corresponding to the border region 130. The grating 135 is thus formed by virtue of the plural layers of the ML 105 being formed on the substrate 110 having the periodic roughness 140.

In accordance with aspects of the invention, the periodic roughness 140 is structured and arranged such that the grating 135 constitutes an approximate 180° phase shift grating, which suppresses or substantially cancels the $0^{th}$ order diffraction of the incident EUV light by way of destructive interference. For example, the periodic roughness 140 may be provided using a plurality of spaced apart protrusions 145 on the surface of the substrate 110. The size of the protrusions 145 and the spacing between the protrusions 145 are determined in conjunction with the other parameters of the mask 100 and imaging system to achieve the desired 180° phase shift property of the grating 135. Moreover, the protrusions 145 may be formed using any suitable manufacturing techniques, such as depositing and patterning a layer of material on the top surface of the substrate 110, or alternatively by etching a plurality of trenches (e.g., rectangular trenches or a sawtooth pattern) in the top surface of the substrate 110.

Figure 5:
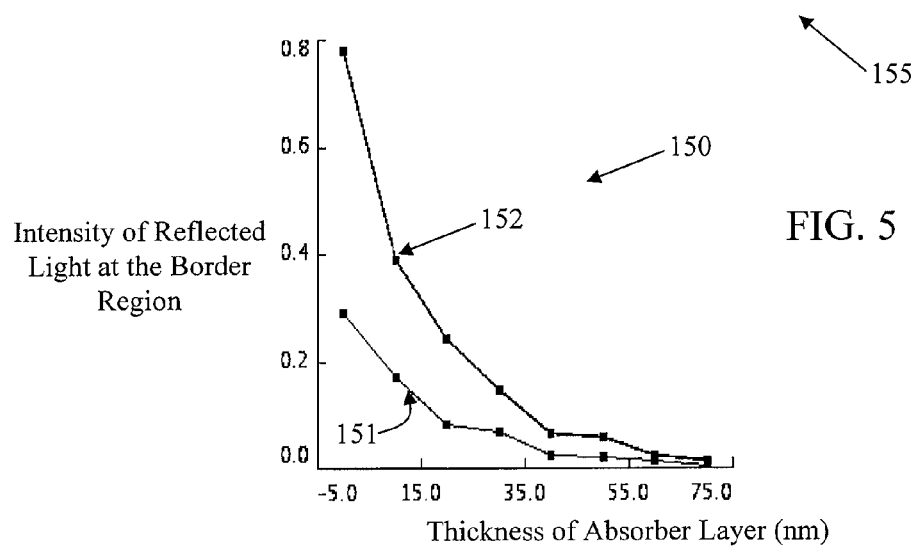
FIG. 5 shows data demonstrating how an EUVL mask of FIG. 4 reduces reflection at the border region.

FIG. 5 shows a graph 150 and a table 155 demonstrating how the mask 100 comprising the grating 135 in accordance with aspects of the invention reduces border reflection compared to a similar EUVL mask without the grating. In the graph 150, the x-axis represents thickness of the absorber layer 120 at the border region 130, and the y-axis represents intensity of border reflected light at the wafer. Curve 151 corresponds to a mask having the grating 135, while curve 152 corresponds to a mask without the grating. The table 155 shows the same data as the graph 150, with the thickness of the absorber layer 120 in the first row 156, the respective intensities in the second row 157 and third row 158, and the percent decrease in intensity provided by the grating 135 in the fourth row 159. It is evident from FIG. 5 that an EUVL mask having the grating 135 in accordance with aspects of the invention exhibits reduced reflection at the border region. In this manner, implementations of the invention reduce the black border reflection, which reduces CD variation, which improves spatial dimensioning in EUVL systems.

Figure 6:
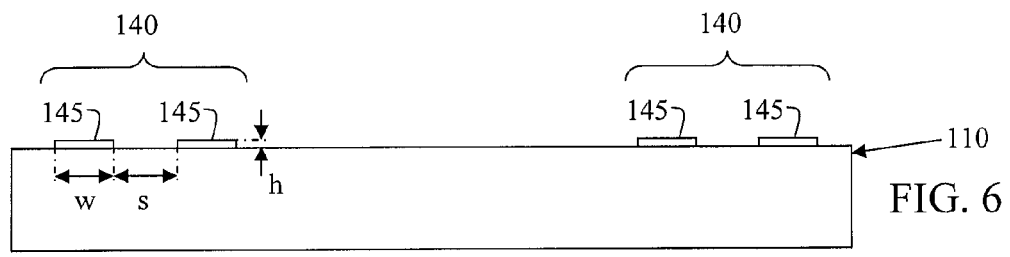

FIGS. 6-9 show respective processing steps and corresponding structures for forming the mask 100 depicted in FIG. 4. As shown in FIG. 6, periodic roughness 140 comprising protrusions 145 is formed at the upper surface of the substrate 110. In embodiments, the protrusions 145 are formed by depositing a layer of material (e.g., Ru or quartz) on the top surface of the substrate 110, forming and patterning a mask on the material (e.g., forming, exposing and developing a layer of photoresist on the material), selectively etching the material using the patterned mask, and subsequently removing the mask (e.g., stripping the photoresist). Alternatively to forming and patterning an additional material on top of the substrate 110, the protrusions may be formed by etching trenches in the substrate, e.g., using a mask and timed etch to achieve a desired depth.

As noted herein, the height of the protrusions 145, whether formed by depositing material or by etching trenches in the substrate, may be determined based on achieving a 180° phase shift grating in the multilayer stack that suppresses or cancels the $0^{th}$ order diffraction. In embodiments designed for a 0.25 numerical aperture 13.5 nm wavelength EUV imaging system, each protrusion 145 has a height "h" of about 2 nm and a width "w" of about 60 nm, and there is a spacing "s" of about 60 nm between each protrusion 145, although other dimensions may be used within the scope of the invention wherein such dimensions are determined in order to achieve a 180° sub-resolution phase shift grating. The remainder of the substrate 110 other than the area of the periodic roughness 140 has a smooth surface of less than about 0.15 nm rms, and preferably less than about 0.1 nm rms.

Figure 7:
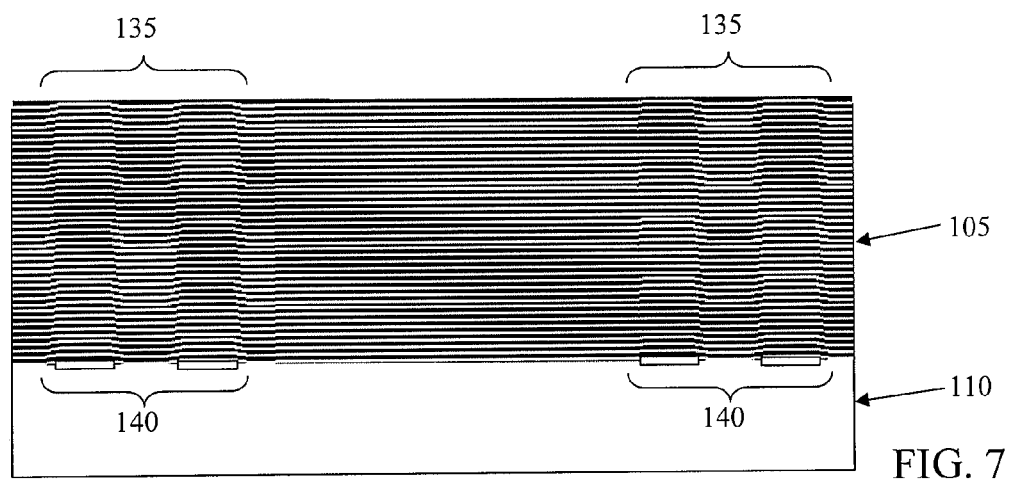

As shown in FIG. 7, the ML 105 is formed on the substrate 110. In embodiments, the ML 105 comprises alternating layers of Mo and Si, each layer having a thickness of about 2 to 5 nm, although other suitable materials and/or thicknesses may be used within the scope of the invention. The layers of the ML 105 may be formed using any suitable process, such as ion beam deposition (IBD), e.g., ion beam sputtering. There may be any number of layers in the ML 105, such as between 30 and 80 paired layers of Mo/Si. The formation of the layers of the ML 105 on the periodic roughness 140 creates the grating 135 in the ML 105 since the unevenness of the periodic roughness 140 propagates upward through the layers of the ML 105.

Figure 8:
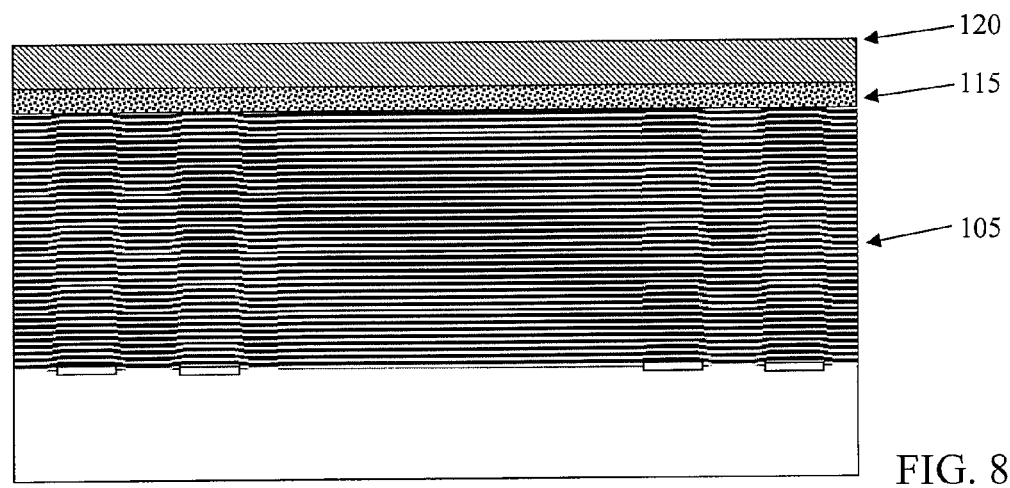

As shown in FIG. 8, the buffer layer 115 is formed on the ML 105, and the absorber layer 120 is formed on the buffer layer 115. In embodiments, the buffer layer 115 comprises an Ru film having a thickness of about 2-5 nm, although other suitable materials and/or thicknesses may be used within the scope of the invention. The buffer layer 115 may be formed by any suitable process, such as ion beam deposition (IBD), e.g., ion beam sputtering. In embodiments, the absorber layer 120 comprises a TaBN film having a thickness of about 40-90 nm, although other suitable materials and/or thicknesses may be used within the scope of the invention. The absorber layer 120 may be formed by any suitable process, such as magnetron sputtering. The structure depicted in FIG. 8 is referred to as a mask blank.

Figure 9:
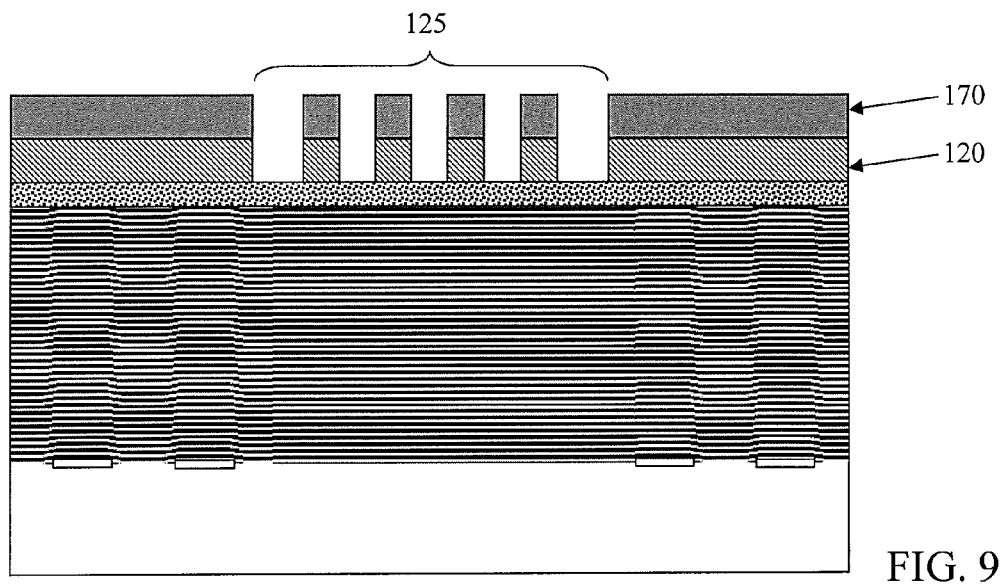

As shown in FIG. 9, the absorber layer 120 may be patterned in the active area 125. The absorber layer 120 may be patterned using conventional semiconductor manufacturing techniques. For example, a hardmask layer 170 (e.g., an oxide of silicon) may be formed on the absorber layer 120, and a resist layer formed on the hardmask layer 170 and patterned with the desired features to be subsequently transferred to the absorber layer 120. The hardmask layer 170 may be etched through the patterned resist layer using, e.g., a fluorine based chemistry. Subsequently, the absorber layer 120 may be etched through the patterned hardmask layer 170 with another etch that is suitable for the material of the absorber layer 120, and the hardmask layer 170 may be removed using conventional methods. Any desired pattern may be provided in the absorber layer 120.

Figure 10:
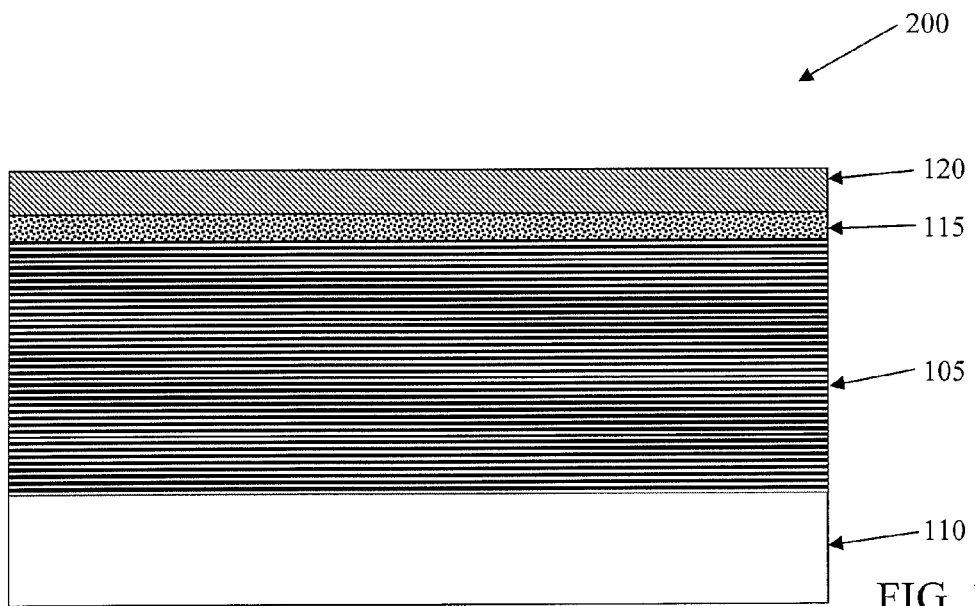

FIGS. 10-12 show respective processing steps and corresponding structures in accordance with additional aspects of the invention. In embodiments, a 180° phase shift structure may be formed in an EUVL mask by forming appropriately sized and spaced trenches in the multilayer reflector underneath the border region. In particular, FIG. 10 shows a mask 200 comprising a ML 105 formed on a substrate 110, a buffer layer 115, and an absorber layer 120. The mask 200 does not include the periodic roughness (e.g., periodic roughness 140), such that the ML 105 is not provided with the grating 135 in the manner described with respect to FIGS. 6-9. The ML 105, buffer layer 115, and absorber layer 120 shown in FIG. 10 may be formed using similar materials and manufacturing techniques as those described with respect to FIGS. 6-9.

As shown in FIG. 11, plural trenches 205 are formed at the border region 130 of the mask 200. The trenches 205 extend through the absorber layer 120 and buffer layer 115, and into the ML 105. The trenches 205 may be formed using conventional semiconductor manufacturing processes, such as forming a hard mask on the absorber layer 120, patterning the hard mask, and performing a different etch for each of the absorber layer 120, the buffer layer 115, and the ML 105. In a particular exemplary embodiment, the ML 105 is etched using a $Cl_2$/

O₂/He reactive ion etch (RIE), although any suitable etch chemistry may be used for the respective layers within the scope of the invention.

In embodiments, the width and depth of each trench 205 and the spacing between trenches 205 are determined based on creating a 180° phase shift in the ML 105 at the border region 130. In an exemplary implementation designed for a 0.25 numerical aperture 13.5 nm wavelength EUV imaging system, each trench 205 has a width of about 60 nm and a depth of about 100 nm, and the spacing between adjacent trenches 205 is about 60 nm, although the invention is not limited to these values and any suitable sub-resolution dimensions may be used. The trenches 205 may be formed in the border region 130 before or after the patterning of the absorber layer 120 in the active area 125.

As shown in FIG. 12, a protective film 245 may be formed on the sidewalls of the trenches 205 in order to protect the exposed material of the ML 105. The film may be formed, for example, using an oxidation process.

FIG. 13 shows a table 255 demonstrating how the mask 200 comprising the trenches 205 in accordance with aspects of the invention reduces border reflection compared to a similar EUVL mask without the trenches 205. The table 255 shows the percent reduction of intensity of reflected light from the border region between a mask 200 having trenches 205 and a conventional mask without the trenches, as a function of etch depth of the trenches 205 and thickness of the absorber layer 120.

Figure 14:
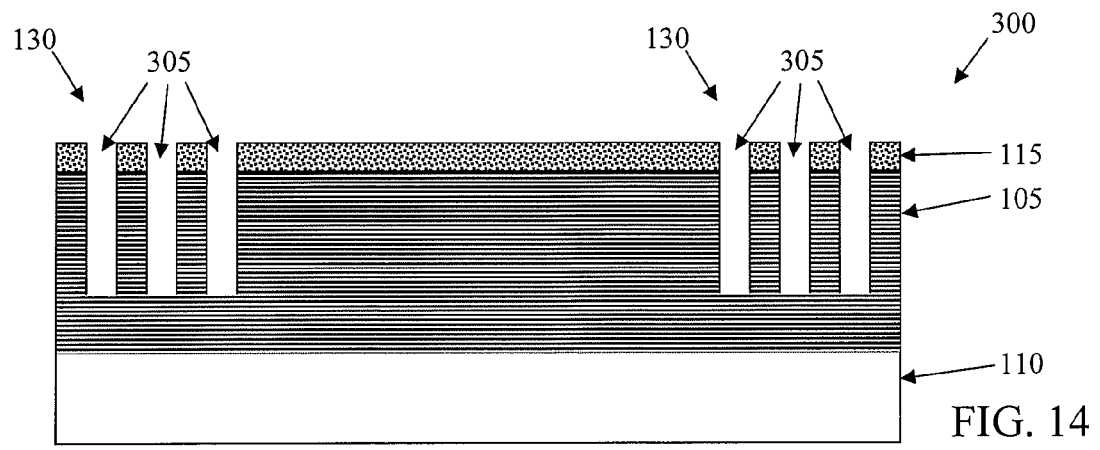
FIGS. 14-16 show processing steps and structures in accordance with aspects of the invention.
Figure 15:
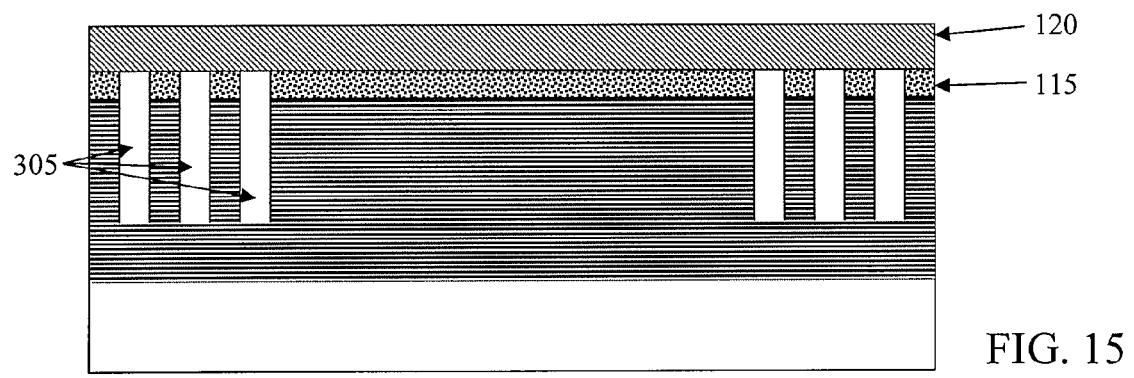
Figure 16:
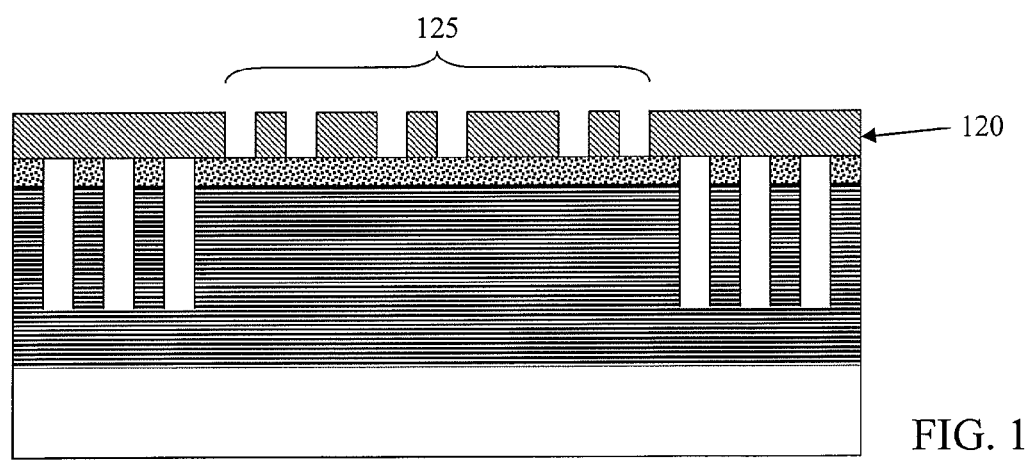

FIGS. 14-16 show respective processing steps and corresponding structures in accordance with further aspects of the invention. In particular, FIG. 14 shows a mask 300 comprising a ML 105 formed on a substrate 110, and a buffer layer 115 formed on the ML 105. The mask 300 does not include the periodic roughness (e.g., periodic roughness 140), such that the ML 105 is not provided with the grating 135 in the manner described with respect to FIGS. 6-9. The ML 105 and the buffer layer 115 shown in FIG. 14 may be formed using similar materials and manufacturing techniques as those described with respect to FIGS. 6-9.

Still referring to FIG. 14, trenches 305 are etched in the buffer layer 115 and ML 105 prior to forming the absorber layer. The trenches 305 are formed in what will ultimately be the border region 130 of the mask 300. The trenches 305 may be formed in a manner similar to trenches 205 described above, e.g., forming and patterning a hard mask on the buffer layer 115 and then using an appropriate etch chemistry for each of the buffer layer 115 and the ML 105. In embodiments, the width and depth of each trench 305 and the spacing between trenches 305 are determined based on creating a 180° phase shift in the ML 105 at the border region 130. In an exemplary implementation designed for a 0.25 numerical aperture 13.5 nm wavelength EUV imaging system, each trench 305 has a width of about 60 nm and a depth of about 100 nm, and the spacing between adjacent trenches 305 is about 60 nm, although the invention is not limited to these values and any suitable dimensions may be used.

As shown in FIG. 15, the absorber layer 120 is formed on the buffer layer 115 after the trenches 305 have been formed. In embodiments, the absorber layer 120 closes (e.g., seals) the top of each trench 305. The absorber layer 120 may be formed using similar materials and manufacturing techniques as those described with respect to FIGS. 6-9. As shown in FIG. 16, the active area 125 of the absorber layer 120 may be patterned, e.g., in the manner already described herein.

Figures 17, 18:
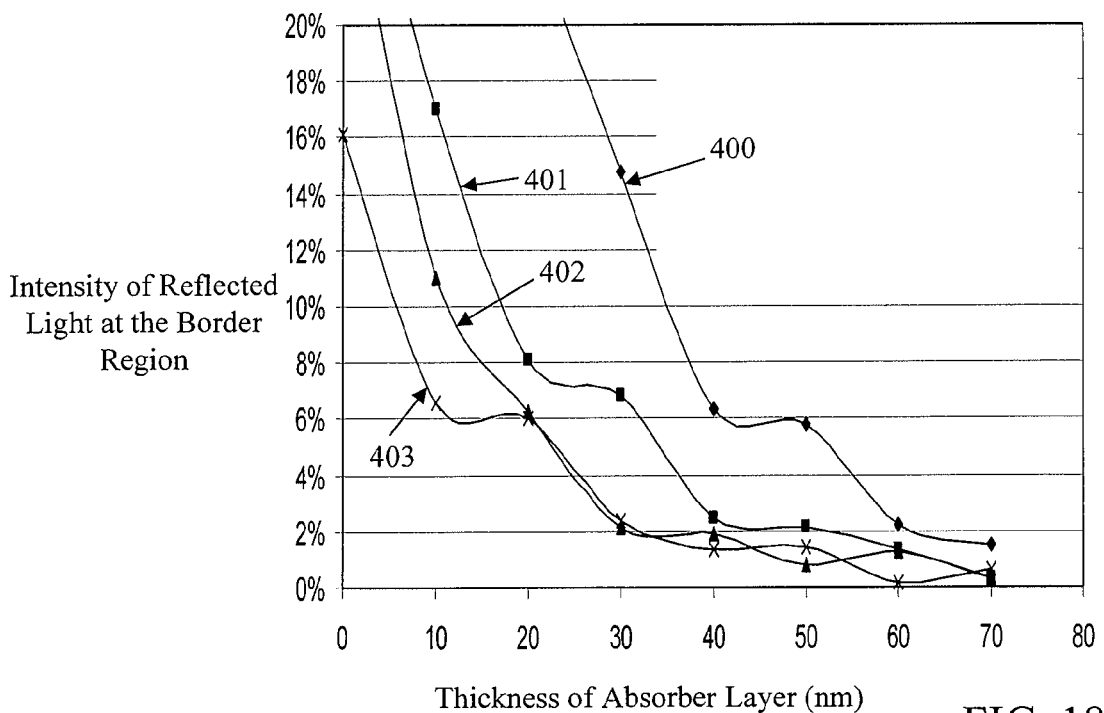
FIG. 17 shows data demonstrating how an EUVL mask of FIG. 16 reduces reflection at the border region.
FIG. 18 shows data demonstrating how EUVL masks in accordance with aspects of the invention reduces reflection at the border region.

FIG. 17 shows a table 355 demonstrating how the mask 300 comprising the trenches 305 in accordance with aspects of the invention reduces border reflection compared to a similar EUVL mask without the trenches 305. The table 355 shows the percent reduction of intensity of reflected light from the border region between a mask 300 with trenches 305 and a conventional mask without the trenches, as a function of etch depth of the trenches 305 and thickness of the absorber layer 120.

FIG. 18 shows a graph comparing the border reflection of a conventional EUVL mask (line 400), a EUVL mask 100 structured and arranged as described with respect to FIGS. 6-9 (line 401), a EUVL mask 200 structured and arranged as described with respect to FIGS. 10-12 (line 402), and a EUVL mask 300 structured and arranged as described with respect to FIGS. 14-16 (line 403).

Figure 19:
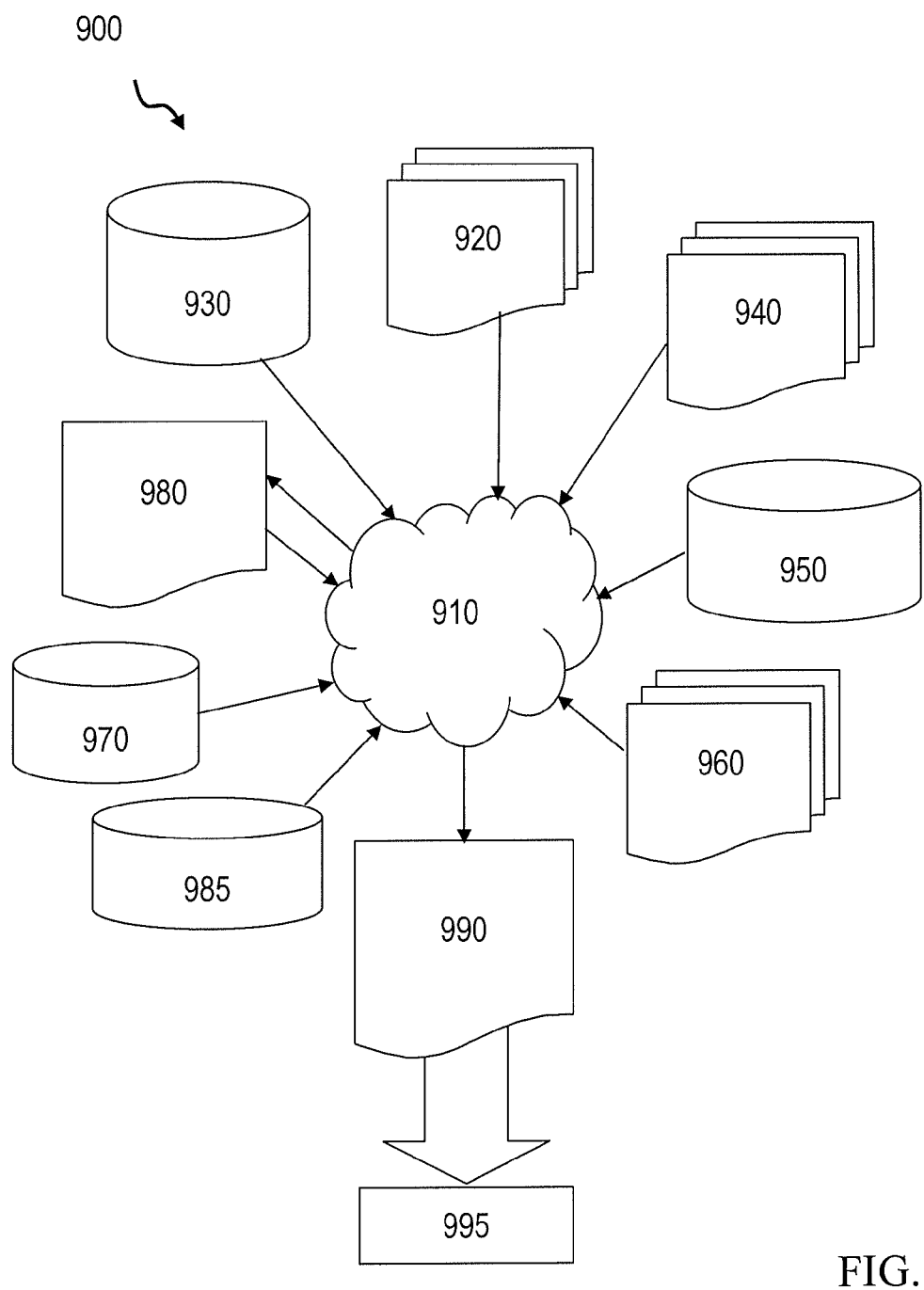
FIG. 19 is a flow diagram of a design process used in semiconductor design, manufacture, and/or test.

FIG. 19 is a flow diagram of a design process used in semiconductor design, manufacture, and/or test. FIG. 19 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 4, 6-12 and 14-16. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4, 6-12 and 14-16. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4, 6-12 and 14-16 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4, 6-12 and 14-16. In one embodiment, design structure 990 may comprise a compiled, executable HDL simulation model that functionally simulates the devices shown in FIGS. 4, 6-12 and 14-16.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4, 6-12 and 14-16. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

What is claimed:
1. A method of manufacturing a mask, comprising:
  forming a multilayer reflective film comprising a sub-resolution phase shift grating in areas underneath a border region of an absorber layer of an extreme ultraviolet lithography (EUVL) mask, wherein the sub-resolution phase shift grating reduces a reflectivity of the border region of the mask.

2. The method of claim 1, wherein the border region surrounds an active area of the mask, and further comprising patterning the absorber layer in the active area with a pattern for applying to a wafer.

3. The method of claim 1, wherein the forming the multilayer reflective film comprising the sub-resolution phase shift grating comprises:
    forming a periodic roughness on an upper surface of a substrate; and
    forming plural layers of the multilayer reflective film on the periodic roughness and the substrate.

4. The method of claim 3, wherein the periodic roughness causes a non-planar shape to propagate upward through the plural layers of the multilayer reflective film.

5. The method of claim 3, wherein the forming the periodic roughness comprises forming protrusions on the upper surface of the substrate in an area corresponding to the border region.

6. The method of claim 5, wherein the protrusions are sized and shaped to provide the sub-resolution phase shift grating with an approximate 180° phase shift.

7. The method of claim 1, wherein the forming the multilayer reflective film comprising the sub-resolution phase shift grating comprises:
    forming plural layers of the multilayer reflective film on a substrate;
    forming a buffer layer on the multilayer reflective film;
    forming the absorber layer on the buffer layer; and
    forming plural trenches through the absorber layer and the buffer layer and into the multilayer reflective film at the border region.

8. The method of claim 7, wherein the plural trenches are sized and shaped to provide the sub-resolution phase shift grating with an approximate 180° phase shift.

9. The method of claim 1, wherein the forming the multilayer reflective film comprising the sub-resolution phase shift grating comprises:
    forming plural layers of the multilayer reflective film on a substrate;
    forming a buffer layer on the multilayer reflective film;
    forming plural trenches through the buffer layer and into the multilayer reflective film at the border region; and
    forming the absorber layer over the plural trenches and the buffer layer.

10. The method of claim 9, wherein the plural trenches are sized and shaped to provide the sub-resolution phase shift grating with an approximate 180° phase shift.

11. The method of claim 1, further comprising forming the sub-resolution phase shift grating with an approximate 180° phase shift that suppresses or cancels a $0^{th}$ order diffraction.

12. A method of manufacturing a mask, comprising:
    forming plural protrusions on an upper surface of a substrate;
    forming a multilayer reflective film on the plural protrusions and the upper surface of the substrate;
    forming a buffer layer on the multilayer reflective film;
    forming an absorber layer on the buffer layer; and
    patterning an active area of the absorber layer with a pattern for applying to an area of a wafer,
    wherein the plural protrusions are formed in an area corresponding to a border region outside that surrounds the active area; and
    the plural protrusions create a phase shift grating in portions of the multilayer reflective film such that the multilayer reflective film comprises the phase shift grating in areas underneath the border region.

13. The method of claim 12, wherein the plural protrusions cause portions of the multilayer reflective film to be non-planar beneath the border region.

14. The method of claim 12, wherein the phase shift grating is an approximate 180° phase shift grating that reduces a reflectivity of the border region of the mask.

15. An extreme ultraviolet lithography (EUVL) mask, comprising:
    a substrate;
    a multilayer reflective film on the substrate;
    a buffer layer on the multilayer reflective film; and
    an absorber layer on the buffer layer and comprising an active area and a border region;
    wherein the multilayer reflective film comprises a phase shift grating in areas underneath the border region; and
    the phase shift grating reduces a reflectivity of the border region of the mask.

16. The mask of claim 15, wherein:
    an upper surface of the substrate is substantially planar in an area corresponding to the active region; and
    a periodic roughness is on the upper surface of the substrate in an area corresponding to the border region.

17. The mask of claim 16, wherein:
    layers of the multilayer reflective film are substantially planar in the area corresponding to the active region; and
    the phase shift grating comprises non-planar portions of the layers of the multilayer reflective film in the area corresponding to the border region.

18. The mask of claim 15, wherein the phase shift grating comprises plural trenches in layers of the multilayer reflective film in an area corresponding to the border region.

19. The mask of claim 18, wherein the plural trenches extend through the absorber layer and the buffer layer and into the multilayer reflective film.

20. The mask of claim 19, further comprising a protective layer on sidewalls of the plural trenches.

21. The mask of claim 18, wherein the plural trenches extend through the buffer layer and into the multilayer reflective film, and are covered by the absorber layer.

22. The mask of claim 15, wherein the phase shift grating provides an approximate 180° phase shift.

23. The mask of claim 15, wherein the phase shift grating suppresses or cancels a $0^{th}$ order diffraction.

24. The mask of claim 15, wherein the phase shift grating reduces the reflectivity of the border region of the mask by destructive interference.

* * * * *